(12) United States Patent
Wickeraad

(10) Patent No.: US 7,469,356 B2
(45) Date of Patent: Dec. 23, 2008

(54) SIGNALS CROSSING MULTIPLE CLOCK DOMAINS

(75) Inventor: John A. Wickeraad, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 380 days.

(21) Appl. No.: 11/063,274

(22) Filed: Feb. 22, 2005

(65) Prior Publication Data

US 2006/0190758 A1 Aug. 24, 2006

(51) Int. Cl.
G06F 1/12 (2006.01)
G06F 1/04 (2006.01)
G06F 5/00 (2006.01)

(52) U.S. Cl. ............... 713/600; 713/400; 713/500; 345/558; 714/39; 375/372

(58) Field of Classification Search ................ 713/600
See application file for complete search history.

(56) References Cited

U.S. PATENT DOCUMENTS

| 4,873,703 | A | 10/1989 | Crandall et al. |
| 5,745,770 | A | 4/1998 | Thangadurai et al. |
| 5,838,692 | A | 11/1998 | Tobin |
| 5,949,136 | A | 9/1999 | Hammel |
| 6,003,107 | A | 12/1999 | Ranson et al. |
| 6,208,703 | B1 | 3/2001 | Cavanna et al. |
| 6,681,353 | B1 | 1/2004 | Barrow |
| 6,732,301 | B1 | 5/2004 | Landry et al. |
| 6,816,989 | B2 | 11/2004 | Litt |

Primary Examiner—Nitin C Patel

(57) ABSTRACT

Methods, systems, and circuits are provided for signals crossing multiple clock domains. One circuit includes a number of different clock domains located on different portions of the ASIC. A number of input/output (I/O) ports are provided to couple signals to and from the ASIC. The circuit includes means for moving internal signals from a subset of the number of different clock domains of multiple frequencies to a different clock domain for monitoring, observation, counting, and debug.

36 Claims, 3 Drawing Sheets

SIGNALS CROSSING MULTIPLE CLOCK DOMAINS

Application specific integrated circuits (ASICs) may use a set of input/output (I/O) pins to observe internal signals for debug. Such I/O pins or "ports" are sometimes referred to as monitor/observation/debug ports. Typically, these ports have viewed signals from one clock domain. In some cases, a particular port may allow signals to be viewed "live" without going through any flip-flops. Generally no observation of debug is performed on smaller clock domains, but rather focused on the main or core clock domain. Unfortunately this does not allow for signals to be observed in the other clock domains if there is a problem.

DETAILED DESCRIPTION

Embodiments of the invention cover methods, systems, and circuits for signals crossing multiple clock domains. One method embodiment includes monitoring multiple clock domains. The method includes receiving different sets of signals within a first source clock domain on an application specific integrated circuit (ASIC) to a multiplexer. Sets of signals selected by the multiplexer are loaded into a clock crossing first in first out (FIFO) using the source clock domain and unloaded using a destination clock domain to allow selected sets of signals to be moved to the destination clock domain. Different sets of signals in the destination clock domain can be monitored and observed by a logic analyzer.

Figure 1:
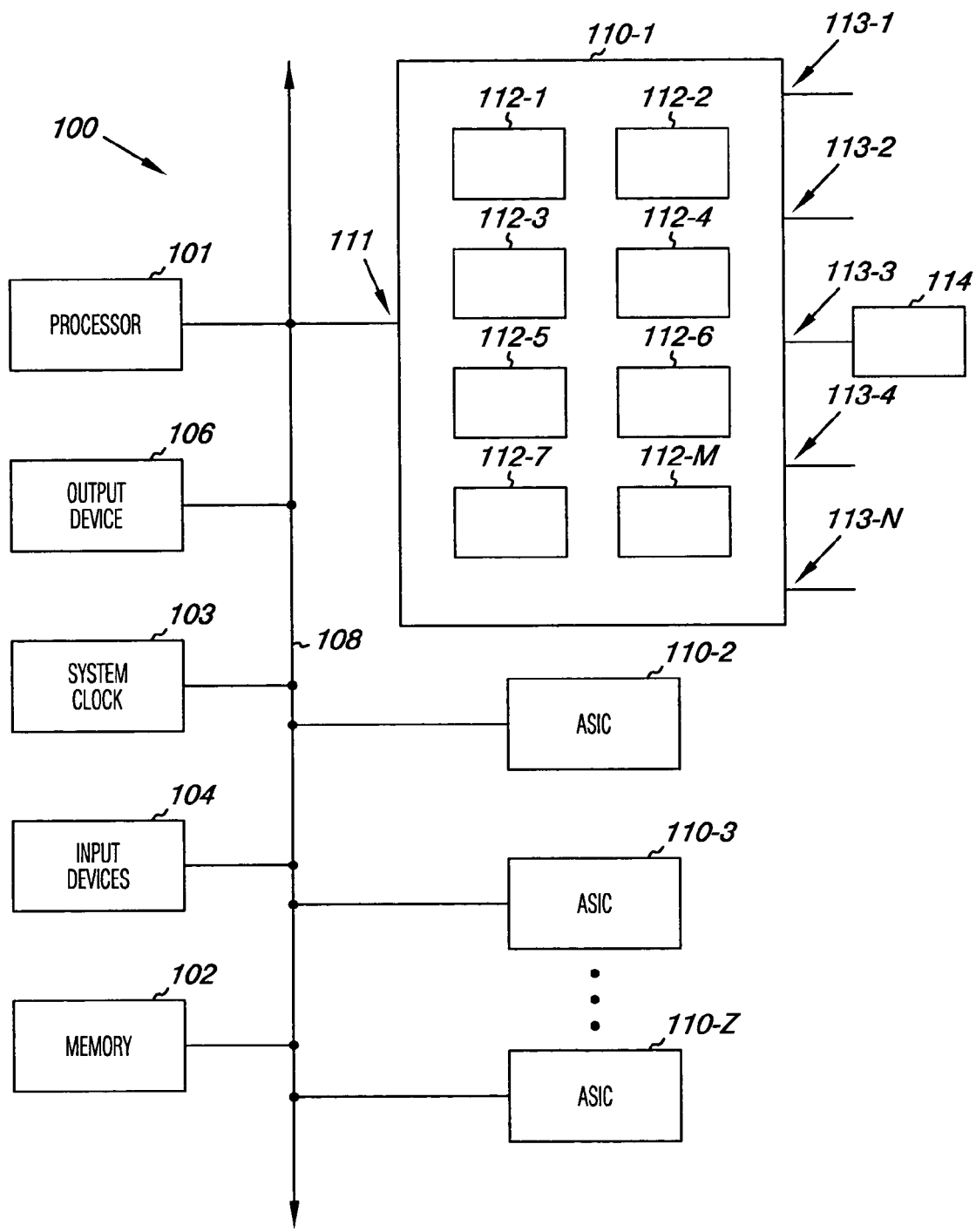
FIG. 1 illustrates a block diagram for a computing system environment including a number of ASICs.

FIG. 1 illustrates a block diagram for a computing system environment including a number of ASICs. As shown in FIG. 1 a computing system can include one or more system processors 101, one or more memories 102, one or more system clocks 103, one or more input devices 104, and one or more output devices 106. Such components can be connected together via a system bus 108. One of ordinary skill in the art will appreciate the variety and types of such components as may be included in a computing system. More detail is not provided here so as not to obscure the embodiments of this disclosure.

As shown in the embodiment of FIG. 1, a number of application specific integrated circuits (ASICs), 110-1, 110-2, 110-3, . . . , 110-Z, may be included in the computing system 100. The designator "Z" is used to indicate that a number of ASICs may be included with a given computing system 100. As illustrated with example ASIC 110-1, a given ASIC can include a number of different clock domains, 112-1, . . . , 112-M, having similar and/or dissimilar clock frequencies. The designator "M" is used to indicate that a number of different clock domains may be included with a given ASIC 110-1. On ASIC 110-1 each of the "M" different clock domains can have a different clock associated therewith. So, for example, one clock domain 112-1 may have a different clock frequency from another clock domain, e.g., 112-2. The clock associated with clock domain 112-2 may again be different from the clock associated with clock domain 112-3. At the same time, a clock associated with a given clock domain may be equivalent to the clock used in another clock domain. For example, the clock associated with clock domain 112-5 may have the same clock frequency as the clock associated with clock domain 112-6. It is noted that even though different clock domains may have the same clock frequency the phase alignment may be unknown. In such cases, a clock crossing first in first out (FIFO), as described in more detail below, may be used to treat the clock domains as-having different frequencies. Embodiments are not limited to the examples described here in connection with ASIC 110-1.

As shown in FIG. 1, example ASIC 110-1 includes one or more inputs connected to the bus 108, shown generally for ease of illustration as 111. Additionally, example ASIC 110-1 includes a number of I/O pins, or ports, 113-1, . . . , 113-N which can be connected to other components or circuits. The designator "N" is used to indicate that a number of I/O pins or ports (hereinafter referred to as "ports") may be included with a given ASIC 110-1. As shown in the embodiment of FIG. 1 and described in more detail below, at least one I/O port, e.g., port 113-3, can be connected to a logic analyzer 114 as the same are known and understood by one of ordinary skill in the art to monitor, observe, and/or debug signals from various ones of the clock domains 112-1, . . . , 112-M on the ASIC 110-1. ASICs 110-2, 110-3, . . . , 110-T, can include similar circuit configurations to that discussed in connection with ASIC 110-1. Embodiments, are not limited to the example illustration provided in FIG. 1.

A copending, commonly assigned application by the same inventor, entitled, "Monitoring Multiple Clock Domains", incorporated herein in full by reference, describes pipelining or routing signals from several of the different clock domains 112-1, . . . , 112-M to an area of a particular I/O port, e.g., 113-3, on the ASIC 110-1 for monitoring, observation and/or debug by a logic analyzer, e.g., 114. As described therein, for example, signals from one or a few of these clock domains, principally the main or core clock domain, e.g., 112-1 and several other clock domains, may be pipelined or routed to the a particular I/O port. However, the sheer number of different clock domains 112-1, . . . , 112-M may make it too cumbersome to pipeline, or route, signals from all of the different clock domains 112-1, . . . , 112-M to an area of the particular I/O port, e.g., 113-1, as the number of clock domains on a given ASIC grows in size. Therefore, as described in more detail in connection with FIG. 2, embodiments of the present invention provide circuits and methods to clock cross multiple clock domains, e.g., to allow different sets of signals to be moved to another clock domain and/or to a particular area near an I/O port for monitoring, observation, and debug.

Figure 2:
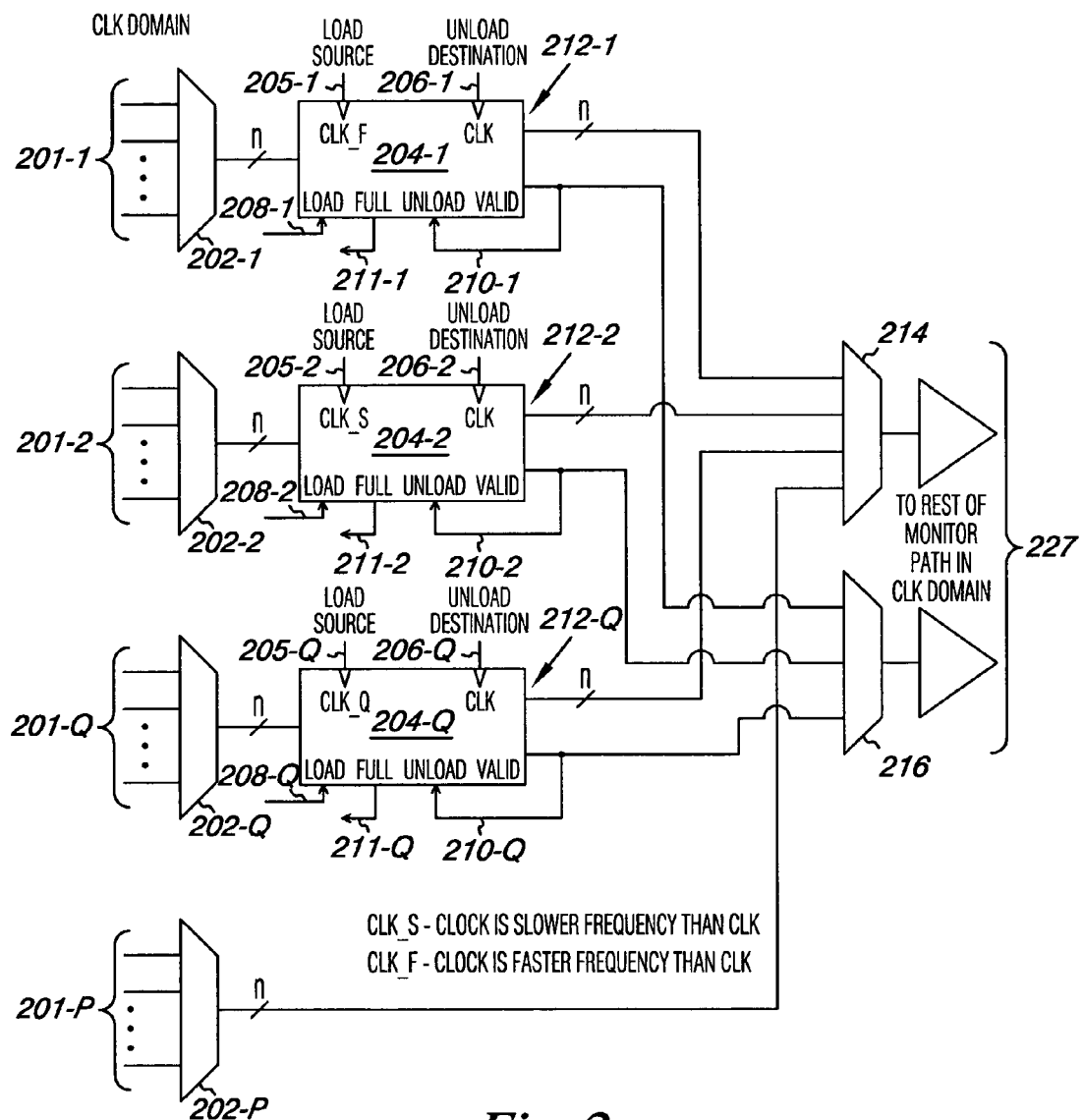
FIG. 2 illustrates an embodiment for signals crossing multiple clock domains.

FIG. 2 illustrates an embodiment for signals crossing multiple clock domains. FIG. 2 illustrates a number of clock domains 201-1, . . . , 201-P on an ASIC such as the multiple clock domains 112-1, . . . , 112-M shown on ASIC 110-1 in FIG. 1. The number of clock domains 201-1, . . . , 201-P could be a first subset of the total number of clock domains present on a given ASIC. That is second, third, and other subsets could similarly exist and be defined within a given ASIC. Within each respective clock domain, different sets of signals can be connected to a multiplexer, shown as 202-1, . . . , 202-P respectively, to selectively choose which signals from within that clock domain are of interest, e.g., for monitoring, observation, debug, etc.

The output of each multiplexer 202-1, . . . , 202-Q for clock domains 201-1, 201-Q are input to a clock crossing first in first out (FIFO), illustrated as 204-1, . . . , 204-Q respectively. In each case the clock crossing FIFO includes a clock input associated with a particular, different clock domain (represented in FIG. 2 as "CLK") as well as a clock input for the clock frequency of the source clock domain, e.g., 201-1, ..., 201-Q, connected to the clock crossing FIFO 204-1, ..., 204-Q. In this disclosure, the CLK is also referred to as a "clock associated with a destination clock domain" and the clock frequency of the different signals output from the respective multiplexers 202-1 ..., 202-Q for the different clock domains 201-1, ..., 201-Q is referred to as a "source clock domain" to distinguish the different frequency of signal input to the clock crossing FIFOs, 204-1, ..., 204-Q. In the illustrative example of FIG. 2 the CLK, or clock associated with a destination clock domain, is the clock frequency of clock domain 201-P. Embodiments, however, are not limited to this example.

As shown in the example embodiment of FIG. 2, each clock crossing FIFO 204-1, ..., 204-Q includes a load signal 208-1, ..., 208-Q to communicate when data from the associated multiplexer 202-1, ..., 202-Q is valid and the associated clock crossing FIFO, 204-1, ..., 204-Q is not full in order to load signals into the clock crossing FIFO 204-1, ..., 204-Q. Each clock crossing FIFO 204-1, ..., 204-Q includes a set of data output signals 212-1, ..., 212-Q, and a valid output signal 210-1, ..., 210-Q indicating when a set of data output signals 212-1, ..., 212-Q is valid. One of ordinary skill in the art will appreciate upon reading this disclosure the manner in which signals from one clock domain can be input to a clock crossing FIFO to be output according to another clock frequency. For an example illustration of the same reference is made to commonly assigned, issued U.S. Pat. No. 6,208,703, issued to Cavanna et al., Mar. 27, 2001, which is incorporated herein in full by reference.

In the illustrative embodiment of FIG. 2, the clock frequency of clock domain 201-2 has an associated clock frequency which is a slower clock frequency (shown as "CLK_S" clock input) than CLK, i.e., the clock associated with the destination clock domain 201-P. In other words, for clock crossing FIFO 204-2 "the clock (CLK) associated with the destination clock domain" has a higher clock frequency than "a clock associated with the source clock domain", e.g., clock domain 201-2. And, in the example of FIG. 2 the clock frequency of clock domain 201-1 has an associated clock frequency which is a faster clock frequency (shown as "CLK_F" clock input) than CLK. In other words, for clock crossing FIFO 204-1 "the clock (CLK) associated with the destination clock domain" has a lower clock frequency than "a clock associated with the source clock domain", e.g., clock domain 201-1. The designator "Q" is used to indicate that a number of different clock domains may be provided with clock crossing FIFOs including a clock (CLK) associated with a particular, different, e.g., destination, clock domain on a given ASIC 110-1. In the example of FIG. 2, the clock frequency of clock domain 201-Q has an associated clock frequency which may be slower, faster, and/or roughly the same but the clock phase may be unknown. Embodiments are not limited to these examples illustrated in FIG. 2.

As noted above, within each respective clock domain 201-1, ..., 201-P different sets of signals can be connected to a multiplexer, shown as 202-1, ..., 202-P. In each respective clock domain the multiplexer 202-1, ..., 202-P can select, from among the different sets of signals received thereto, which signals from within that clock domain are of interest, e.g., for monitoring, observation, counting, debug, etc. In the example embodiment of FIG. 2, each multiplexer 202-1 ..., 202-Q selects a set of signals of "n" bits to send as input to the associated clock crossing FIFO 204-1, ..., 204-Q. The reader will appreciate that each multiplexer 202-1, ..., 202-Q can be controlled by circuitry, not shown, which exists in the source clock domain. For example, the control circuitry can be provided by configuration registers that a processor can write to as the same is known and understood in the art. The designator "n" is used to indicate that a signal of a variable word width, e.g., 16 bits, can be chosen according to design rule. Embodiments, however, are not limited to the example of 16 bit widths. In the example of FIG. 2 it is also shown that the multiplexer 202-P for clock domain 201-P, having the clock used by the FIFOs 204-1, ..., 204-Q as the CLK (i.e., clock associated with the destination clock domain) similarly selects a set of signals of "n" bits from among different sets of signals received to the multiplexer 202-P in clock domain 202-P. A selected set of signals is loaded as input to a given clock crossing FIFO 204-1, ..., 204-Q upon receiving a load signal 208-1, ..., 208-Q from its associated clock crossing FIFO 204-1, ..., 204-Q. As the reader will appreciate, the source clock domain can include circuitry, not shown, which asserts the load signal at the appropriate time, e.g., whenever the FIFOs 204-1, ..., 204-Q are not full. The load signal 208-1, ..., 208-Q is usually asserted when the associated clock crossing FIFO 204-1, 204-Q is not full, as indicated by full signals 211-1, ..., 211-Q. However, in some embodiments the load signal 208-1, ..., 208-Q can include other qualifiers such as when a set of signals is valid.

In the above example for clock domains 201-2 a selected set of signals selected from among the different sets of signals received to the multiplexer 202-2 could be loaded into the clock crossing FIFO 204-2 each clock cycle of the clock associated with the destination clock domain, e.g., 201-P, since the clock crossing FIFO 204-2 can be unloaded faster than the rate at which data is arriving thereto. In this example, the clock crossing FIFO 204-2 can be relatively small in size, e.g., four word entries would suffice to capture all of the input data and synchronize to the destination clock domain.

As will be appreciated by the reader, data output signals 212-1, ..., 212-Q can be unloaded from these clock crossing FIFOs 204-2 and 204-Q every cycle there is valid data in the FIFO. Thus, the valid output signals 210-1, 210-2, ..., 210-Q are illustrated as input back into the clock crossing FIFOs 204-1, ..., 204-Q to unload the FIFOs.

In the above example for clock domain 201-1 a selected set of signals selected from among the different sets of signals received to the multiplexer 202-1 can be loaded into the clock crossing FIFO 204-1 when there is room available in the clock crossing FIFO 204-1, i.e., the "full signal" 211-1 is not asserted. In this scenario, selected signals may be dropped or "lost" since the clock crossing FIFO 204-1 cannot unload data as fast as the rate at which data is arriving thereto, i.e. CLK is slower than CLK_F. That is, as the reader will appreciate, pointers have to be synchronized to the destination clock domain and there has to be enough word entries that each set of signals can go through the FIFO without being dropped. However, this may not be too concerning when the intent is foremost to be able to monitor, observe, count, and/or debug at least some sample signals from the given clock domain 201-1. Moreover, in the case where the clock crossing FIFO 204-1 is full and data may be potentially lost an overflow signal could be written to the clock crossing FIFO 204-1. For example, the source clock domain can have a state machine, not shown, which detects a "full" state, e.g., there was valid data that couldn't be loaded into the FIFO. As the reader will appreciate, such a state machine could keep a bit to indicate this state and set an overflow signal which could be stored/read by a processor later. Similarly, the overflow signal could be written to the FIFO if the word width is widened by a bit. The next time signals were loaded to the FIFO the overflow bit could be set and passed along out of the FIFO to the destination clock domain. In this scenario, the size (i.e., the number of entries) of the clock crossing FIFO 204-1 can lessen the overflow issue depending on usage model.

In one embodiment of the above example for clock domain 201-1 a selected set of signals selected from among the different sets of signals received to multiplexer 202-1 can be loaded into to clock crossing FIFO 204-1 upon receipt of a load signal 208-1. In this scenario, the load signal 208-1 is asserted to load selected signals from multiplexer 202-1 at a rate which will not overflow the clock crossing FIFO 204-1 based on a difference between the CLK frequency of the clock crossing FIFO (i.e., the frequency at which the clock crossing FIFO unloads data) and the clock frequency of the faster clock domain 201-1.

A valid output signal 210-1, . . . , 210-Q will be asserted every cycle there is valid data in the FIFOs 204-1, . . . , 204-Q. This signal will indicate when a data output signal 212-1, . . . , 212-Q is valid. As the reader will appreciate the valid output signals 210-1, . . . , 210-Q indicate a valid set of data output signals from the clock crossing FIFOs 204-1, . . . , 204-Q. As shown in the example embodiment of FIG. 2, the set of data output signals 212-1, . . . , 212-Q from each of the clock crossing FIFOs 204-1, . . . , 204-Q is connected to a multiplexer 214 to be selected and connected to the destination clock domain and/or to the rest of a signal path in a monitor, observe, counting, and/or debug path 227. A valid output signal 210-1, . . . , 210-Q is also connected to a multiplexer 216. And similarly, the valid output signals 210-1, . . . , 210-Q can be selected by multiplexer 216 and connected to the destination clock domain and/or to the rest of a signal path in a monitor, observe, counting, and/or debug path 227. That is, in some embodiments, the signal path 227 can connect to an area of a particular I/O port, e.g., 113-3, on the ASIC 110-1 for monitoring, observation and/or debug by a logic analyzer, e.g., 114, as shown in FIG. 1.

Thus, it has been shown that the set of data output signals and valid output signals from multiple clock domains can be properly synchronized and connected to an embedded logic analyzer and/or a counter, as the same are known and understood, in a destination clock domain 201-P. As the reader will appreciate, counters are often provided in one clock domain of an ASIC and are useful for counting how many times events happen on the ASIC. Desirably, the counter would be provided in as fast a clock domain as possible. This technique allows signals from multiple clock domains to share a common valuable resource such as a set of counters. It will also be appreciated that after the set of data output signals and valid output signals have been moved to a particular destination clock domain they can be provided to buffers 227 to pipeline to a particular port on the ASIC used for monitoring, observation, and debug as illustrated more in FIG. 3.

Figure 3:
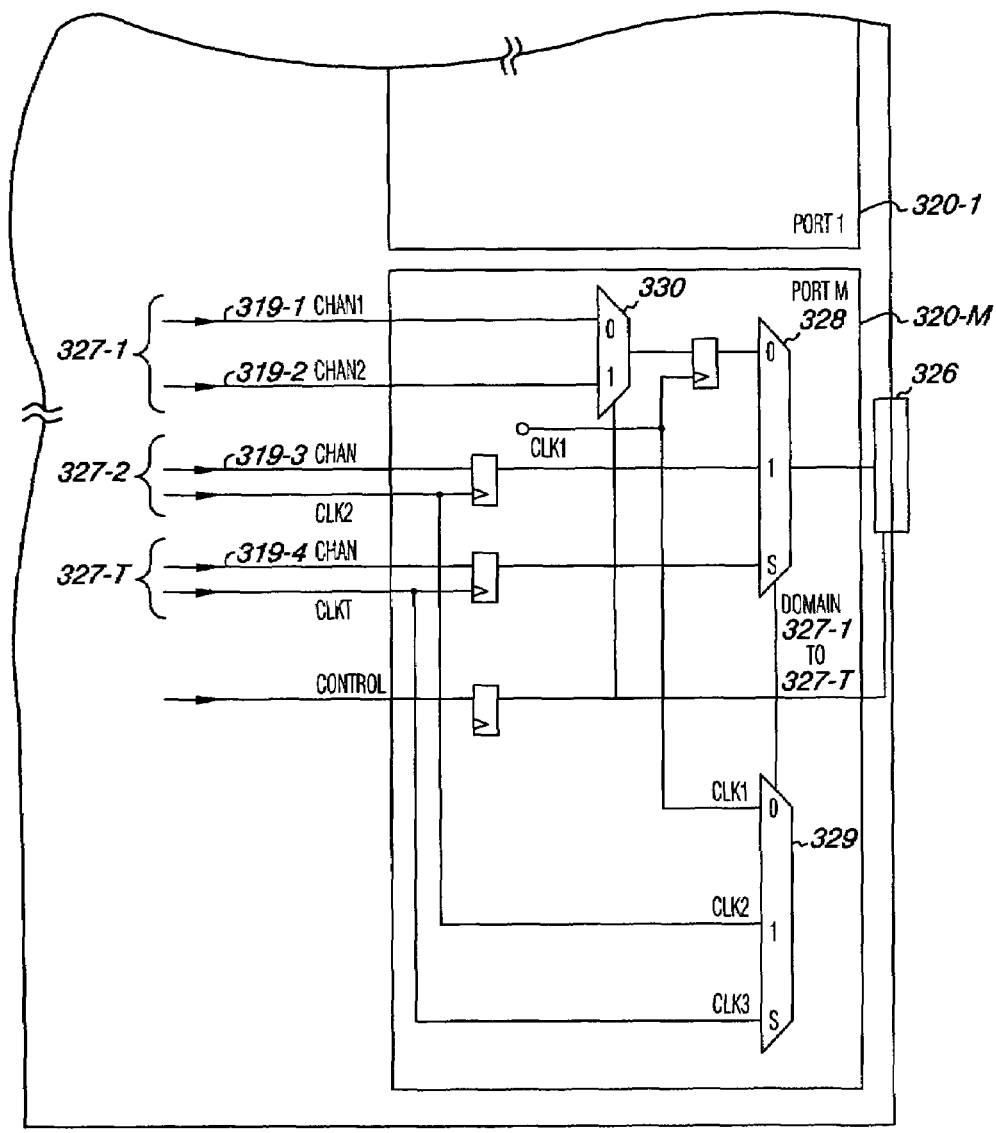
FIG. 3 illustrates an embodiment for a number of different clock domains being pipelined to an area of a particular I/O port.

FIG. 3 illustrates a number of different clock domains being pipelined to an area of a particular I/O port, e.g., 113-3, on the ASIC 110-1 for monitoring, observation and/or debug by a logic analyzer, e.g., 114, as shown in FIG. 1. FIG. 3 illustrates an example embodiment of three different clock domains being pipelined to the particular I/O port-326 for ASIC 320-M. As discussed in more detail in copending, commonly assigned application by the same inventor, entitled, "Monitoring Multiple Clock Domains", incorporated herein in full by reference, pipelining or routing signals from several of the different clock domains 327-1, . . . , 327-T to an area of a particular I/O port, e.g., 326, on the ASIC 320-M for monitoring, observation and/or debug by a logic analyzer can involve connecting the different clock domains 327-1, . . . , 327-T to a multiplexer which can selectively choose which set of signals to output to the logic analyzer. More detail of the same is not provided herein so as not to obscure the embodiments of the present invention.

As the reader will appreciate the embodiments of the invention allow localized clock crossing FIFOs, e.g., 204-1, . . . , 204-Q as shown in FIG. 2, to move data from the clock domain of interest to a destination clock domain such that any and all clock domains on a given ASIC can be monitored, observed, counted, and/or debugged. In some embodiments different sets of signals from smaller clock domains are moved to the main or core clock domain, e.g., destination clock domain, before being moved to a monitoring, observation, and/or debug port. In other embodiments, multiple internal signals from a subset on the number of different clock domains of multiple frequencies are moved directly to a monitoring, observation, and/or debug port in a different clock domain.

Although specific embodiments have been illustrated and described herein, those of ordinary skill in the art will appreciate that an arrangement calculated to achieve the same techniques can be substituted for the specific embodiments shown. This disclosure is intended to cover adaptations or variations of various embodiments of the invention. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the invention includes other applications in which the above structures and methods are used. Therefore, the scope of various embodiments of the invention should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the embodiments of the invention require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for monitoring multiple clock domains, comprising:
   receiving sets of signals within each of more than one source clock domains on an application specific integrated circuit (ASIC) to a multiplexer associated with the respective source clock domain;
   using the associated multiplexer to select a set of signals from among the sets of signals for each source clock domain;
   loading the selected sets of signals into a clock crossing first in first out (FIFO) associated with the respective source clock domain using a clock associated with the respective source clock domain;
   unloading a chosen FIFO using a clock associated with a destination clock domain; and
   wherein the destination clock domain is associated with a location beyond an input/output port on the ASIC.

2. The method of claim 1, wherein the method includes pipelining the selected sets of signals from an output of the chosen clock crossing FIFO to the input/output port on the ASIC using the clock associated with the destination clock domain.

3. The method of claim 1, wherein the clock associated with the destination clock domain has a higher clock frequency than clocks associated with any of the more than one source clock domains.

4. The method of claim 3, wherein the method includes loading the selected sets of signals into the chosen clock crossing FIFO in each clock cycle of the respective source clock domain.

5. The method of claim 4, wherein the method includes providing an output signal from the chosen clock crossing FIFO indicating when data from an output of the chosen clock crossing FIFOs is valid.

6. The method of claim 1, wherein the method includes providing a load signal to the chosen clock crossing FIFO as the selected sets of signals are received to the chosen clock crossing FIFO.

7. The method of claim 1, wherein the destination clock domain has a lower clock frequency than clocks associated with any of the more than one source clock domains.

8. The method of claim 7, wherein the method includes loading the selected sets of signals into the chosen clock crossing FIFO when there is room available in the chosen clock crossing FIFO.

9. The method of claim 8, wherein the method includes loading the selected sets of signals into the chosen clock crossing FIFO when a load signal is provided to the chosen clock crossing FIFO.

10. The method of claim 9, wherein the method includes selectively providing the load signal to the chosen clock crossing FIFO.

11. The method of claim 1, wherein the destination clock domain includes an embedded logic analyzer to receive the selected set of signals.

12. The method of claim 1, wherein the destination clock domain includes a counter to receive the selected set of signals.

13. A method for monitoring multiple clock domains, comprising:
receiving first sets of signals to a first multiplexer associated with a first source clock domain on an application specific integrated circuit (ASIC);
receiving second sets of signals to a second multiplexer associated with a second source clock domain on the ASIC;
using the respective multiplexers to select a set of signals from among the respective sets of signals;
loading the selected sets of signals into a clock crossing first in first out (FIFO) associated with the respective source clock domain using a clock of the respective source clock domain;
unloading the associated FIFOs using a destination clock domain, wherein the destination clock domain is associated with a location beyond an input/output port on the ASIC and has a higher clock frequency than a clock associated with the source clock domains;
pipelining the selected sets of signals from outputs of the associated clock crossing FIFOs to the location beyond the input/output port; and
choosing, with selection logic in the destination clock domain, the selected sets of signals from one of the first or second clock domains.

14. The method of claim 13, wherein the method includes loading the selected sets of signals into the respective clock crossing FIFO in each clock cycle of the destination clock domain.

15. The method of claim 13, wherein the method includes providing an output signal from the respective clock crossing FIFO indicating when data from an output of the respective clock crossing FIFO is valid.

16. The method of claim 13, wherein the method includes multiplexing the selected sets of signals from outputs of the associated clock crossing FIFOs before pipelining.

17. The method of claim 16, wherein the method includes using a core clock frequency as the clock associated with the destination clock domain.

18. The method of claim 16, wherein the method includes loading the selected sets of signals into the associated clock crossing FIFO when there is room available in the associated clock crossing FIFO.

19. The method of claim 18, wherein the method includes providing an overflow signal from the associated clock crossing FIFO when the associated clock crossing FIFO is full.

20. The method of claim 16, wherein the method includes providing a load signal to the associated clock crossing FIFO to load the selected sets of signals at a rate which does not overflow the associated clock crossing FIFO.

21. The method of claim 16, wherein the method includes communicating the output of the clock crossing FIFO associated with the first source clock domain and the output of the clock crossing FIFO associated with the second source clock domain to a third multiplexer.

22. The method of claim 21, wherein the method includes communicating selected sets of signals from the destination clock domain to the third multiplexer.

23. The method of claim 22, wherein the method includes pipelining an output of the third multiplexer to the input/output port on the ASIC.

24. A method for monitoring multiple clock domains, comprising:
receiving different sets of signals to a multiplexer associated with a first source clock domain on an application specific integrated circuit (ASIC) to select a set of signals from among the different sets of signals;
loading selected sets of signals from the first source clock domain into a clock crossing first in first out (FIFO) associated with a first source clock domain, the clock crossing FIFO using the source clock domain and unloaded using a destination clock domain associated with an embedded loaic analyzer, wherein the destination clock domain has a higher clock frequency than a clock associated with the first source clock domain;
receiving different sets of signals to a second multiplexer associated with a second source clock domain on the ASIC to select a set of signals from among the different sets of signals;
loading selected sets of signals from the second source clock domain into a clock crossing FIFO associated with the second source clock domain, the clock crossing FIFO using the source clock domain and unloaded using the destination clock domain, wherein the destination clock domain has a lower clock frequency than a clock associated with the second source clock domain;
connecting an output of the clock crossing FIFO associated with the first source clock domain and an output of the clock crossing FIFO independently associated with the second source clock domain to a third multiplexer; and
connecting selected sets of signals from the destination clock domain to the third multiplexer.

25. The method of claim 24, wherein the method includes pipelining an output of the third multiplexer to a particular input/output (I/O) port on the ASIC.

26. An application specific integrated circuit (ASIC), comprising:
- a number of different clock domains located on different portions of the ASIC;
- a number of input/output (I/O) ports to couple signals to and from the ASIC; and
- a subset of the number of different clock domains each including:
  - a multiplexer to select a set of signals from among different sets of signals within each respective clock domain; and
  - a clock crossing first in first out (FIFO) to receive selected sets of signals within each respective clock domain, the FIFO using a source clock domain to load and using a destination clock domain associated with a logic analyzer to unload in order to allow the selected sets of signals to be moved to the destination clock domain.

27. The ASIC of claim 26, wherein a first source clock domain within the subset has a clock frequency which is lower than the clock associated with the destination clock domain.

28. The ASIC of claim 27, wherein a second source clock domain within the subset has a clock frequency which is higher than the clock associated with the destination clock domain.

29. The ASIC of claim 28, wherein a set of data output signals of the clock crossing FIFO in the first source clock domain and a set of data output signals of the clock crossing FIFO in second source clock domain are connected to a data signal multiplexer.

30. The ASIC of claim 29, wherein a valid data output signal of the FIFOs is input of the FIFOs to unload the FIFOs.

31. The ASIC of claim 30, wherein the valid data output signal of the FIFOs is to a valid signal multiplexer.

32. The ASIC of claim 31, wherein the destination clock domain is a core clock domain for the ASIC, and wherein different sets of signals from the core clock domain are connected to the data signal multiplexer.

33. The ASIC of claim 32, wherein the ASIC includes circuitry to pipeline different sets of signals from the data signal multiplexer to a particular I/O port from among the number I/O ports.

34. The ASIC of claim 33, wherein the ASIC includes circuitry to pipeline valid signals from the valid signal multiplexer to the particular I/O port.

35. The ASIC of claim 34, wherein the ASIC includes a port multiplexer located in an area of the particular I/O port to receive the different sets of signals pipelined from the multiplexer and to receive different sets of signals from a second subset of the number of different clock domains.

36. The ASIC of claim 35, wherein the port multiplexer located in the area of the particular I/O port can select a particular set of signals to send out of the particular I/O port to the logic analyzer.

* * * * *

UNITED STATES PATENT AND TRADEMARK OFFICE
CERTIFICATE OF CORRECTION

PATENT NO. : 7,469,356 B2  Page 1 of 1
APPLICATION NO. : 11/063274
DATED : December 23, 2008
INVENTOR(S) : John A. Wickeraad It is certified that error appears in the above-identified patent and that said Letters Patent is hereby corrected as shown below:

In column 7, line 15, in Claim 6, delete "sets" and insert -- set --, therefor.

In column 8, line 45, in Claim 24, delete "loaic" and insert -- logic --, therefor.

In column 10, line 15, in Claim 33, after "number" insert -- of --.

Signed and Sealed this

Sixteenth Day of February, 2010

David J. Kappos
*Director of the United States Patent and Trademark Office*